(12) United States Patent
Matsumoto et al.

(10) Patent No.: US 9,454,041 B2
(45) Date of Patent: Sep. 27, 2016

(54) LIQUID CRYSTAL DEVICE, METHOD FOR MANUFACTURING LIQUID CRYSTAL DEVICE, AND ELECTRONIC APPARATUS

(71) Applicant: Seiko Epson Corporation, Tokyo (JP)

(72) Inventors: Yoshimichi Matsumoto, Fujimi-machi (JP); Yoshio Taniguchi, Chino (JP); Norikazu Komatsu, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 59 days.

(21) Appl. No.: 14/495,812

(22) Filed: Sep. 24, 2014

(65) Prior Publication Data

US 2015/0098051 A1 Apr. 9, 2015

(30) Foreign Application Priority Data

Oct. 9, 2013 (JP) ................ 2013-211679

(51) Int. Cl.
*G02F 1/1337* (2006.01)
*C23C 14/22* (2006.01)

(52) U.S. Cl.
CPC ....... *G02F 1/133734* (2013.01); *C23C 14/225* (2013.01); *C23C 14/226* (2013.01)

(58) Field of Classification Search
CPC ......... C23C 14/225–14/226; G02F 1/133734; G02F 2001/133738–2001/133749; G02F 1/133719; G02F 1/1343; G02F 1/1347
USPC ........ 349/123, 125, 129, 130, 187; 427/166, 427/162
See application file for complete search history.

(56) References Cited

U.S. PATENT DOCUMENTS

| | | | | |
|---|---|---|---|---|
| 2005/0052600 A1* | 3/2005 | Hashimoto | ....... | G02F 1/133734 349/130 |
| 2006/0088718 A1* | 4/2006 | Shimizu | ............. | C23C 14/0676 428/469 |
| 2006/0231839 A1* | 10/2006 | Shinohara | ......... | G02F 1/133734 257/59 |
| 2007/0002235 A1* | 1/2007 | Tanaka | ............. | G02F 1/133734 349/123 |
| 2007/0224369 A1* | 9/2007 | Kojima | ............... | G02F 1/13378 428/1.2 |
| 2009/0237604 A1* | 9/2009 | Nagae | ............... | G02F 1/133719 349/124 |
| 2010/0006538 A1* | 1/2010 | Asuke | ............... | G02F 1/133719 216/23 |
| 2011/0181822 A1* | 7/2011 | Yamada | ............ | G02F 1/133734 349/123 |
| 2012/0092602 A1* | 4/2012 | Akagawa | .......... | G02F 1/133719 349/125 |

FOREIGN PATENT DOCUMENTS

| | | | |
|---|---|---|---|
| JP | 2003-167255 A | 6/2003 |
| JP | 2007-025529 A | 2/2007 |
| JP | 2007-025530 A | 2/2007 |
| JP | 2012-247596 A | 12/2012 |

* cited by examiner

*Primary Examiner* — Paul Lee
*Assistant Examiner* — Jia Pan
(74) *Attorney, Agent, or Firm* — ALG Intellectual Property, LLC

(57) ABSTRACT

A liquid crystal device includes a liquid crystal layer, and an inorganic oriented film between the liquid crystal layer and an electrode, in which the inorganic oriented film has a first inorganic oriented film that has a first prismatic structure including silicon oxide, and a second inorganic oriented film that is formed so as to cover at least a portion of the first prismatic structure, and includes nitrogen.

9 Claims, 12 Drawing Sheets

FIG. 5
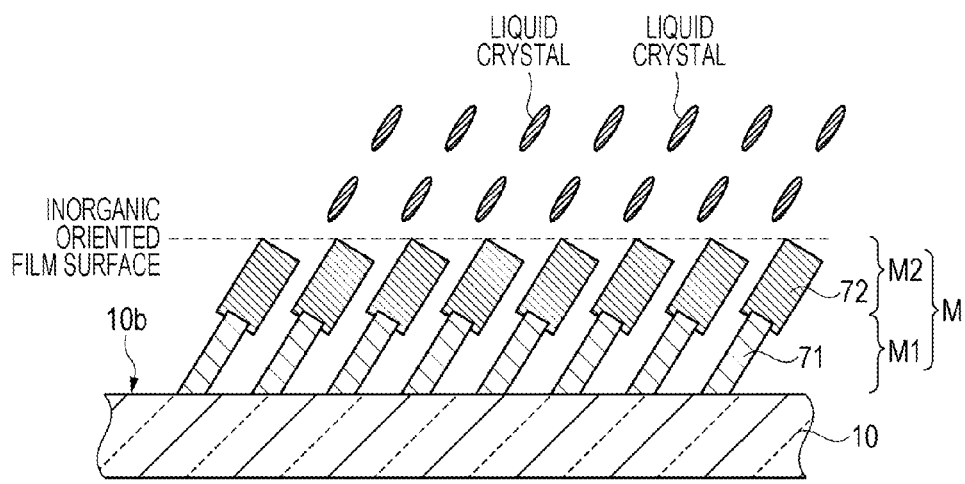
FIG. 6
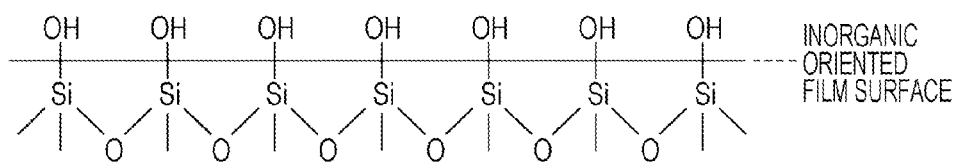
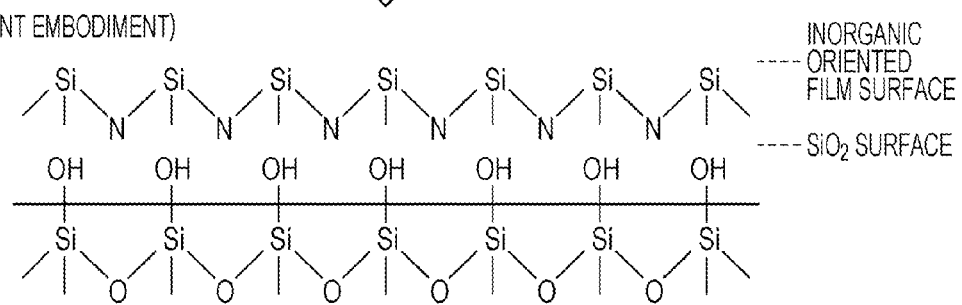

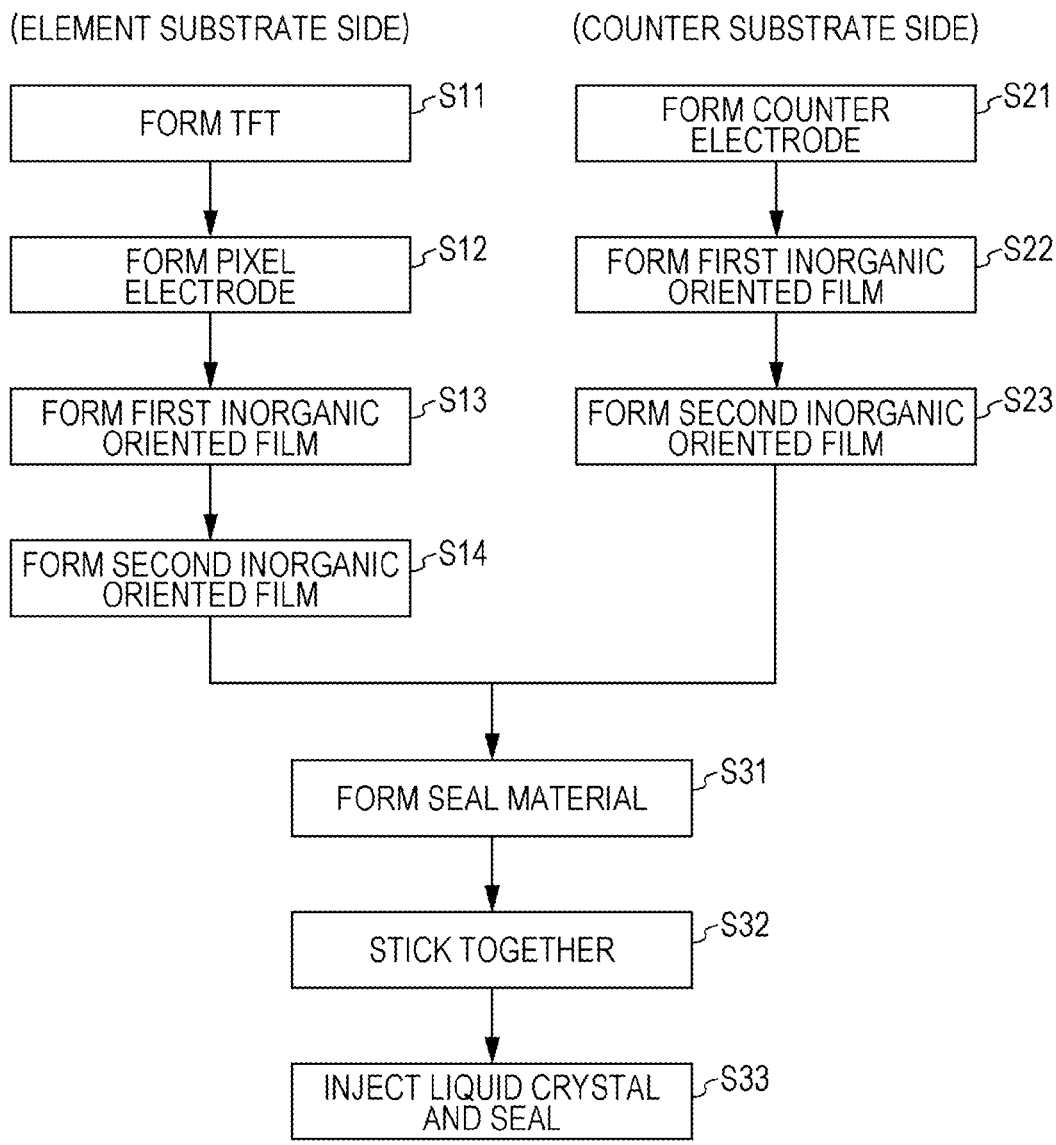

LIQUID CRYSTAL DEVICE, METHOD FOR MANUFACTURING LIQUID CRYSTAL DEVICE, AND ELECTRONIC APPARATUS

BACKGROUND

1. Technical Field

The present invention relates to a liquid crystal device, a method for manufacturing a liquid crystal device, and an electronic apparatus.

2. Related Art

As a liquid crystal device, for example, a liquid crystal device of an active drive system in which a transistor as an element switching-controlling a pixel electrode is included in each pixel, is known. The liquid crystal device is used in, for example, a direct viewing type display and a light valve.

The liquid crystal device has a structure in which a liquid crystal layer is interposed between an element substrate and a counter substrate. On a surface of the liquid crystal layer side of the element substrate, and a surface of the liquid crystal layer side of the counter substrate, for example, an inorganic oriented film in which inorganic materials such as silicon oxide ($SiO_2$) are obliquely vapor deposited, is arranged, as described in JP-A-2003-167255.

However, if the inorganic oriented film is irradiated with light when a silanol group (OH group) is remained on a surface of the inorganic oriented film which is obliquely vapor deposited, there is a problem that orientation regulation force is lowered by causing a photochemical reaction, and display quality is degraded.

SUMMARY

The invention can be realized in the following forms or application examples.

Application Example 1

According to this application example, there is provided a liquid crystal device including a liquid crystal layer, and an inorganic oriented film between the liquid crystal layer and an electrode, in which the inorganic oriented film has a first vapor deposited film that has a prismatic structure including silicon oxide, and a second vapor deposited film that is formed so as to cover at least a portion of the prismatic structure, and includes nitrogen.

According to this application example, by covering a silanol group which is present on a surface of the silicon oxide configuring the first vapor deposited film, with the second vapor deposited film including the nitrogen, it can be suppressed that the silanol group is exposed on a surface of the inorganic oriented film. Accordingly, for example, it can be suppressed that orientation regulation force is lowered by causing a photochemical reaction, as the case where the inorganic oriented film is irradiated with light in which the silanol group is present on the surface. As a result, it can be suppressed that display quality is degraded.

Application Example 2

In the liquid crystal device according to the above application example, the first vapor deposited film is a vertical vapor deposited film, and the second vapor deposited film is an oblique vapor deposited film.

According to this application example, since the first vapor deposited film of a first layer is the vertical vapor deposited film, it can be suppressed that the inorganic oriented film is not arranged on a portion which is a shadow of the electrode as the oblique vapor deposited film. Accordingly, it is possible to enhance orientation properties.

Application Example 3

In the liquid crystal device according to the above application example, the first vapor deposited film and the second vapor deposited film are oblique vapor deposited films.

According to this application example, since the first vapor deposited film of the first layer and the second vapor deposited film of a second layer are the oblique vapor deposited films from the same direction, it is possible to maintain a orientation direction.

Application Example 4

According to this application example, there is provided a method for manufacturing a liquid crystal device including forming an electrode on a base material, forming a first vapor deposited film that has a prismatic structure including silicon oxide on the electrode and the base material, forming a second vapor deposited film that includes nitrogen so as to cover at least a portion of the first vapor deposited film, and arranging a liquid crystal layer on the second vapor deposited film.

According to this application example, since the second vapor deposited film including the nitrogen is formed on the first vapor deposited film including the silicon oxide, it is possible to cover the silanol group which is present on the surface of the silicon oxide, with the second vapor deposited film including the nitrogen. Accordingly, it can be suppressed that the silanol group is exposed on the surface of the inorganic oriented film. Hereby, for example, it can be suppressed that the orientation regulation force is lowered by causing the photochemical reaction, as the case where the inorganic oriented film is irradiated with the light in which the silanol group is present on the surface. As a result, it can be suppressed that the display quality is degraded.

Application Example 5

In the method for manufacturing a liquid crystal device according to the above application example, the first vapor deposited film is formed by a vertical vapor deposition method, and the second vapor deposited film is formed by an oblique vapor deposition method.

According to this application example, since the first vapor deposited film of the first layer is formed by the vertical vapor deposition, it can be suppressed that the inorganic oriented film is not formed on the portion which is the shadow of the electrode as the oblique vapor deposition. Accordingly, it is possible to enhance the orientation properties.

Application Example 6

In the method for manufacturing a liquid crystal device according to the above application example, the first vapor deposited film and the second vapor deposited film are formed by an oblique vapor deposition method.

According to this application example, since the first vapor deposited film of the first layer and the second vapor deposited film of the second layer are formed by the oblique vapor deposition method from the same direction, it is possible to maintain the orientation direction.

Application Example 7

According to this application example, there is provided an electronic apparatus including the liquid crystal device described above.

According to this application example, since the liquid crystal device described above is included, it is possible to provide the electronic apparatus in which degradation of the display quality is suppressed.

BRIEF DESCRIPTION OF THE DRAWINGS

The invention will be described with reference to the accompanying drawings, wherein like numbers reference like elements.

FIG. 5 is a schematic cross-sectional view illustrating a structure of a prismatic structure (column) of an inorganic oriented film.

FIG. 6 is a diagram illustrating a state of a surface of the inorganic oriented film in comparison with the related art and the present embodiment.

FIG. 8 is a flow chart illustrating a method for manufacturing a liquid crystal device in process order.

DESCRIPTION OF EXEMPLARY EMBODIMENTS

Hereinafter, embodiments concretizing the invention will be described in accordance with drawings. Furthermore, the used drawings are appropriately displayed in enlargement or in reduction so that the described portions are in a recognizable state.

Moreover, in the following embodiments, for example, a case of describing as "on the substrate" expresses a case of arranging so as to come in contact on the substrate, or a case of arranging through other components on the substrate, or a case of arranging a portion through other components so that the portion is arranged so as to come in contact on the substrate.

In the embodiment, as an example of a liquid crystal device, an active matrix type liquid crystal device including a thin film transistor (TFT) as a switching element of a pixel, is exemplified, and is described. For example, the liquid crystal device can be suitably used as a light modulation element (liquid crystal light valve) of a projection type display apparatus (liquid crystal projector) described later.

First Embodiment

Configuration of a Liquid Crystal Device

Figure 1:
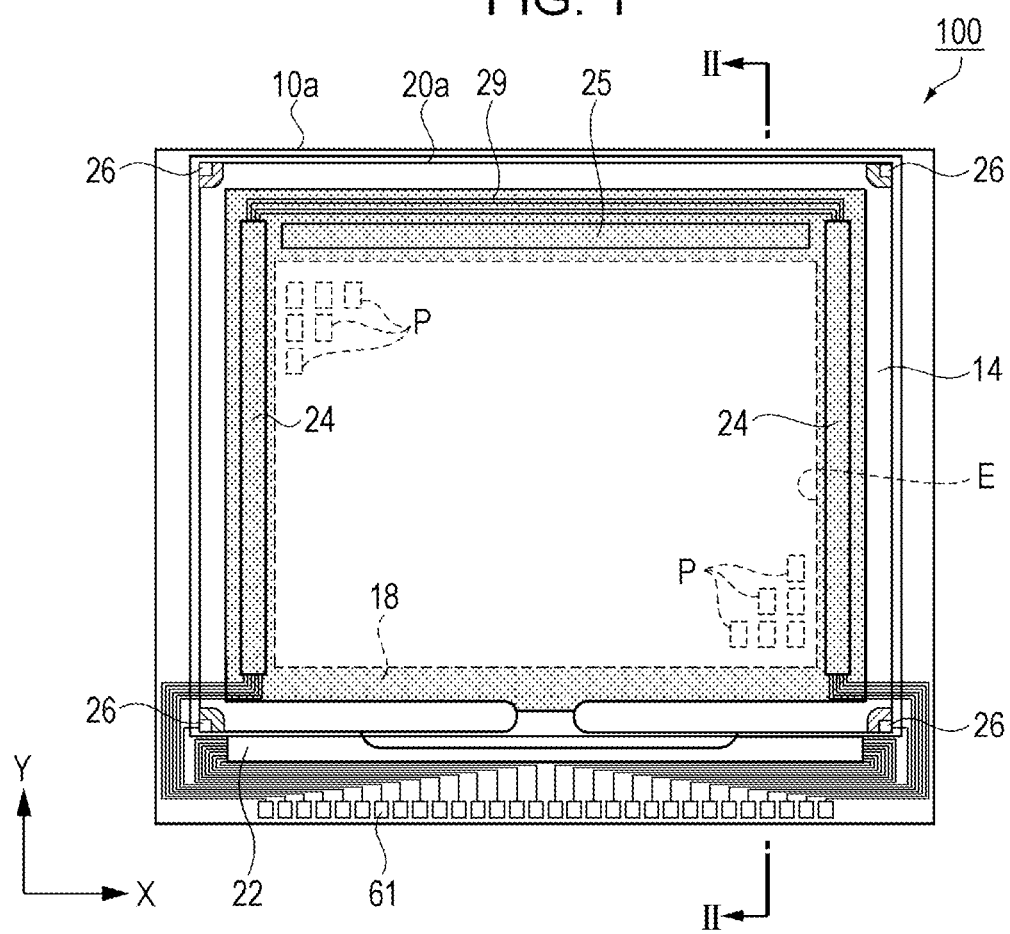
FIG. 1 is a schematic plan view illustrating a configuration of a liquid crystal device according to a first embodiment.
Figure 2:
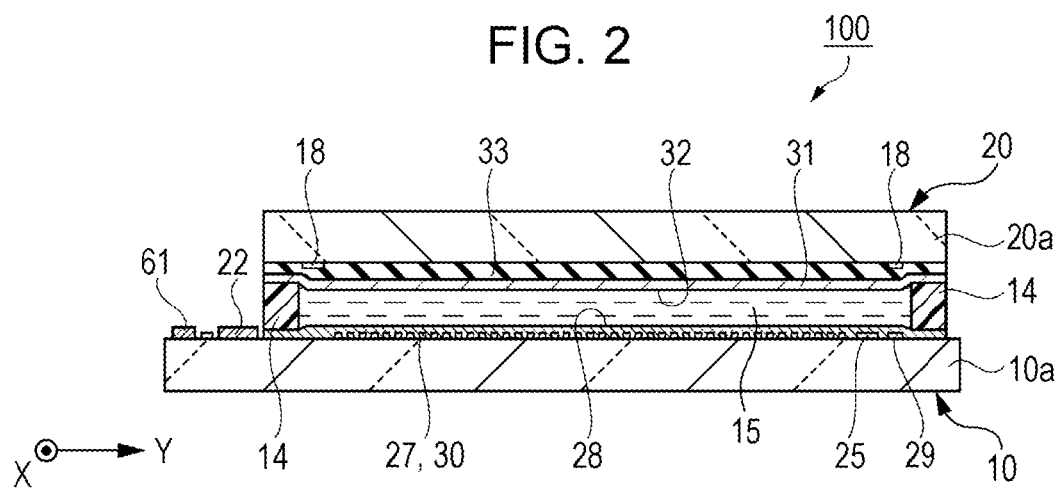
FIG. 2 is a schematic cross-sectional view taken along the II-II line of the liquid crystal device which is illustrated in FIG. 1.
Figure 3:
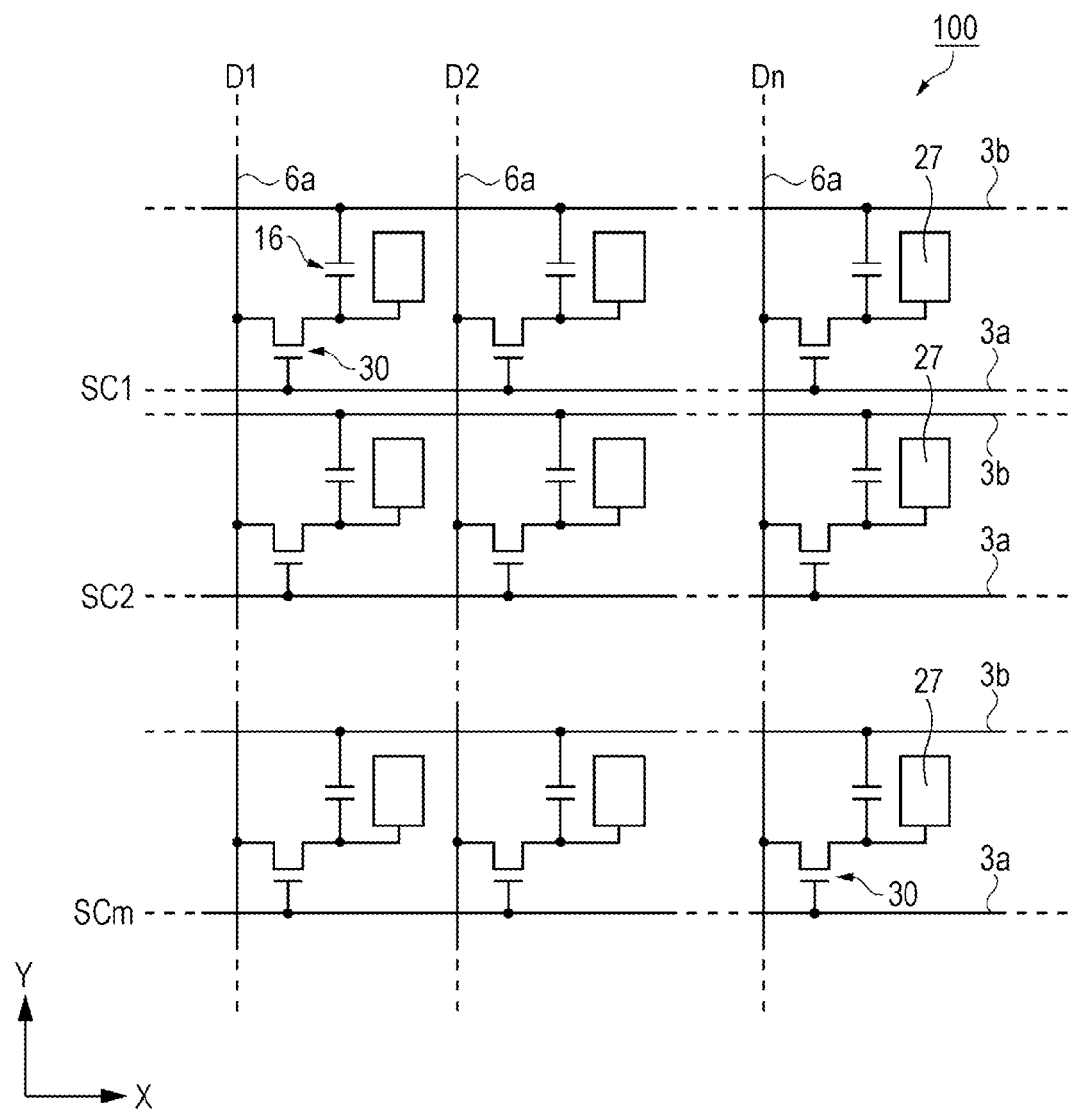
FIG. 3 is an equivalent circuit diagram illustrating an electrical configuration of the liquid crystal device.

FIG. 1 is a schematic plan view illustrating a configuration of the liquid crystal device. FIG. 2 is a schematic cross-sectional view taken along the II-II line of the liquid crystal device which is illustrated in FIG. 1. FIG. 3 is an equivalent circuit diagram illustrating an electrical configuration of the liquid crystal device. Hereinafter, the configuration of the liquid crystal device will be described with reference to FIG. 1 to FIG. 3.

As shown in FIG. 1 and FIG. 2, a liquid crystal device 100 according to the embodiment has an element substrate 10 and a counter substrate 20 that are arranged counter, and a liquid crystal layer 15 that is interposed between a pair of the substrates. As a first base material 10a configuring the element substrate 10, for example, a substrate such as a glass substrate, a quartz substrate, and silicon substrate is used. As a second base material 20a configuring the counter substrate 20, for example, a transparent substrate such as the glass substrate and a quartz substrate, is used.

The element substrate 10 is larger than the counter substrate 20, and the two substrates are joined to each other through a seal material 14 which is arranged along an outer periphery of the counter substrate 20. The gap is filled with the liquid crystal having positive or negative dielectric anisotropy, and thereby the liquid crystal layer 15 is configured.

As the seal material 14, for example, an adhesive such as heat curable or ultraviolet rays curable epoxy resin, is employed. In the seal material 14, a spacer (glass beads) for constantly holding a space between the pair of the substrates, is mixed. The glass beads are used to hold out a cell gap.

On the inside of the seal material 14, a display region E that is an example of a pixel region where a plurality of pixels P contributing to a display are arranged, is arranged. In the vicinity of the display region E, a dummy pixel region (not illustrated) without contributing to the display, is arranged. Furthermore, the illustration is omitted in FIG. 1 and FIG. 2, but a light shielding portion (black matrix: BM) that planarly separates the plurality of the pixels P, individually, in the display region E, is arranged in the counter substrate 20.

Between the seal material 14 and one side portion along the one side portion of the element substrate 10, a data line drive circuit 22 is arranged. Moreover, between the seal material 14 and the display region E along other one side portion countering the one side portion, a check circuit 25 is arranged.

Furthermore, a scanning line drive circuit 24 is arranged between the seal material 14 and the display region E along other two side portions countering to each other which are perpendicular to the one side portion. Between the seal material 14 and the check circuit 25 along other one side portion countering the one side portion, a plurality of wirings 29 which is linked with the two scanning line drive circuits 24, are arranged.

On the inside the seal material 14 which is arranged in a frame shape in the counter substrate 20, a light shielding film 18 (abandonment portion) is arranged in a frame shape in the same manner. For example, the light shielding film 18 is made up of metal or metal oxide having light shielding properties, and the inside of the light shielding film 18 becomes the display region E which has the plurality of the pixels P.

The wiring 29 which is linked with the data line drive circuit 22 and the scanning line drive circuit 24, is connected to a plurality of external connection terminals 61 which are arranged along the one side portion. Hereinbelow, the direction along the one side portion is assumed as an X direction, the direction along other two side portions countering to each other which are perpendicular to the one side portion is assumed as a Y direction, and it will be described. Furthermore, the arrangement of the check circuit 25 is not limited thereto, but the check circuit 25 may be arranged between the seal material 14 and the display region E along the data line drive circuit 22.

As shown in FIG. 2, on a surface of the liquid crystal layer 15 side of the first base material 10a, a pixel electrode 27 having translucency or reflectivity and a thin film transistor (TFT, hereinbelow, referred to as "TFT 30") as an example of a switching element which are arranged in each pixel P, a signal wiring, and an inorganic oriented film 28 that covers them, are formed.

Moreover, a light shielding structure that prevents switching operation from being unstable by light being incident to a semiconductor layer in the TFT 30, is employed. The element substrate 10 of the invention includes at least the pixel electrode 27, the TFT 30, the signal wiring, and the inorganic oriented film 28.

On a surface of the liquid crystal layer 15 side of the counter substrate 20, the light shielding film 18, an insulating layer 33 which is formed so as to cover the light shielding film 18, a counter electrode 31 that is arranged so as to cover the insulating layer 33, and an inorganic oriented film 32 that covers the counter electrode 31, are arranged. The counter substrate 20 of the invention includes at least the light shielding film 18, the counter electrode 31, and the inorganic oriented film 32.

As shown in FIG. 1, the light shielding film 18 surrounds the display region E, and is arranged at a position planarly overlapping the scanning line drive circuit 24 and the check circuit 25. Hereby, the light shielding film 18 plays a role of shading the light which is incident to a periphery circuit including the drive circuit thereof from the counter substrate 20, and preventing the periphery circuit from malfunctioning due to the light. Moreover, by shading the light so that the unnecessary stray light is not incident to the display region E, high contrast in the display of the display region E, is secured.

For example, the insulating layer 33 is made up of inorganic materials such as silicon oxide, and is arranged so as to cover the light shielding film 18 having optical transparency. As a method for forming the insulating layer 33, for example, a method for forming a film using a plasma chemical vapor deposition (CVD) method, is exemplified.

For example, the counter electrode 31 is made up of a transparent conductive film such as ITO (Indium Tin Oxide), covers the insulating layer 33, and is electrically connected to the wiring of the element substrate 10 side by an up and down conduction portion 26 which is arranged at four corners of the counter substrate 20, as shown in FIG. 1.

The inorganic oriented film 28 covering the pixel electrode 27 and the inorganic oriented film 32 covering the counter electrode 31, are selected on the basis of an optical design of the liquid crystal device 100. As the inorganic oriented films 28 and 32, an inorganic oriented film which is oriented approximately vertically with respect to liquid crystal molecules having negative dielectric anisotropy by forming the film with the inorganic materials such as $SiO_x$ (silicon oxide) using a vapor growth method, is exemplified.

The liquid crystal device 100 is, for example, a transmission type, and the optical design of a normally white mode in which transmittance of the pixel P at the time of applying no voltage is greater than the transmittance of the pixel P at the time of applying the voltage, and a normally black mode in which the transmittance of the pixel P at the time of applying no voltage is smaller than the transmittance of the pixel P at the time of applying the voltage, is employed. A polarizing element is used by arranging on an incidence side and an emission side of the light, respectively, according to the optical design.

As shown in FIG. 3, the liquid crystal device 100 has a plurality of scanning lines 3a and a plurality of data lines 6a that are perpendicular to each other with being insulated from each other at least in the display region E, and a plurality of capacity lines 3b. A direction of extending the scanning line 3a is the X direction, and a direction of extending the data line 6a is the Y direction.

In a region which is separated by the scanning line 3a, the data line 6a, and the capacity line 3b, and signal lines thereof, the pixel electrode 27, the TFT 30, and the capacity element 16 are arranged, and they configure a pixel circuit of the pixel P.

The scanning line 3a is electrically connected to a gate of the TFT 30, and the data line 6a is electrically connected to a source and drain region (one source and drain region) on the data line side of the TFT 30. The pixel electrode 27 is electrically connected to a source and drain region (the other source and drain region) on the pixel electrode side of the TFT 30.

The data line 6a is electrically connected to the data line drive circuit 22 (see FIG. 1), and supplies image signals D1, D2, . . . , Dn which are supplied from the data line drive circuit 22, to the pixel P. The scanning line 3a is connected to the scanning line drive circuit 24 (see FIG. 1), and supplies scanning signals SC1, SC2, . . . , SCm which are supplied from the scanning line drive circuit 24, to each pixel P.

The image signals D1 to Dn which are supplied to the data line 6a from the data line drive circuit 22, may be supplied in order of the lines, in this order, and may be supplied to each group with respect to the plurality of the data lines 6a which are adjacent to each other. The scanning line drive circuit 24 pulsingly supplies the scanning signals SC1 to SCm in order of the lines, at a predetermined timing, with respect to the scanning lines 3a.

The TFT 30 which is a switching element, is in an on state for only a predetermined period by input of the scanning signals SC1 to SCm, and thereby, the liquid crystal device 100 has the configuration where the image signals D1 to Dn which are supplied from the data line 6a, are written in the pixel electrode 27 at the predetermined timing. Therefore, the image signals D1 to Dn of a predetermined level which are written in the liquid crystal layer 15 through the pixel electrode 27, are held between the pixel electrode 27 and the counter electrode 31 which are arranged counter through the liquid crystal layer 15, for the predetermined period.

In order to prevent the image signals D1 to Dn which are held from leaking, the capacity element 16 is connected to a liquid crystal capacity which is formed between the pixel electrode 27 and the counter electrode 31, in parallel. The capacity element 16 is arranged between the source and drain region on the pixel electrode side of the TFT 30 and the capacity line 3b. The capacity element 16 has a dielectric layer between two capacity electrodes.

Configuration of a Pixel Configuring a Liquid Crystal Device

Figure 4:
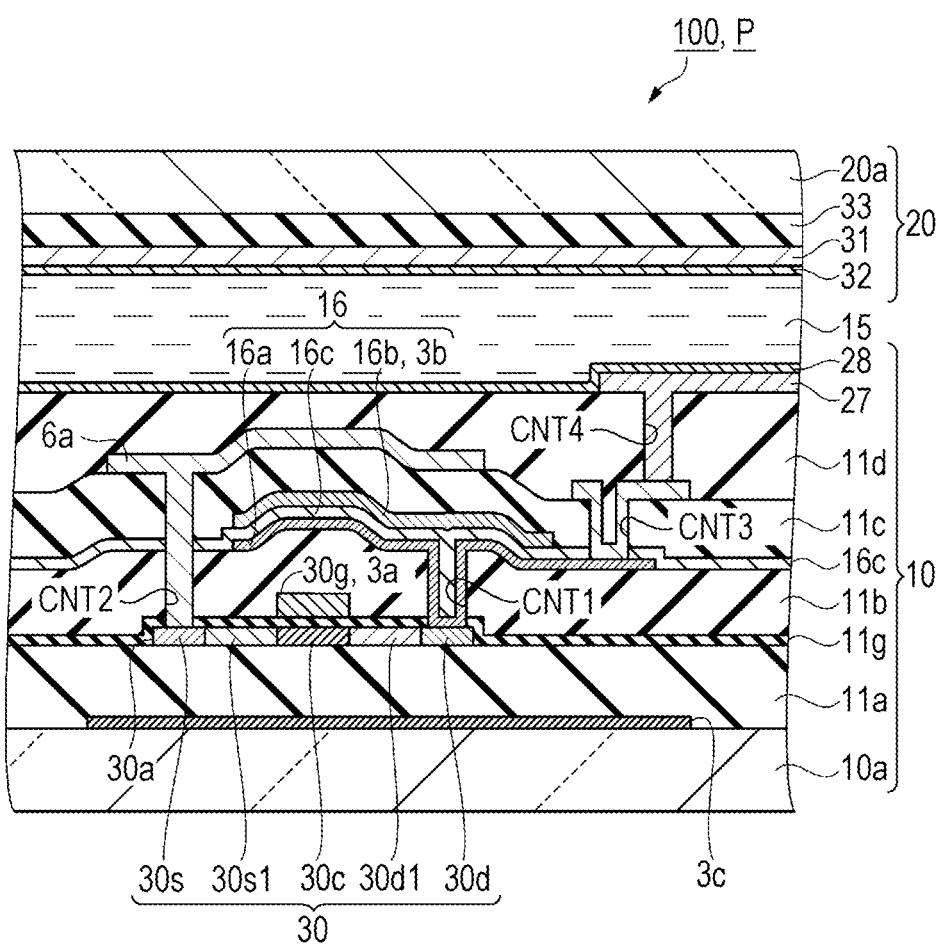
FIG. 4 is a schematic cross-sectional view mainly illustrating a structure of a pixel in the liquid crystal device.

FIG. 4 is a schematic cross-sectional view mainly illustrating a structure of a pixel in the liquid crystal device. Hereinafter, a structure of the pixel in the liquid crystal device, will be described with reference to FIG. 4. Furthermore, FIG. 4 shows a relationship between cross-sectional positions of each component, and is expressed using a statable scale.

As shown in FIG. 4, the liquid crystal device 100 includes the element substrate 10, and the counter substrate 20 that is arranged counter thereto. For example, the first base material 10a configuring the element substrate 10, and the second base material 20a configuring the counter substrate 20, are configured of the quartz substrate or the like.

As shown in FIG. 4, on the first base material 10a, for example, a lower side light shielding film 3c including materials such as aluminum (Al), titanium (Ti), chrome (Cr), and tungsten (W), is formed. The lower side light shielding film 3c is planarly patterned in a lattice shape, and defines an opening region of each pixel P. Moreover, the lower side light shielding film 3c has conductivity, and may be made so as to function as a portion of the scanning line 3a. On the first base material 10a and the lower side light shielding film 3c, a foundation insulating layer 11a which is made up of the silicon oxide or the like, is formed.

On the foundation insulating layer 11a, the scanning line 3a, the TFT 30, and the like, are formed. For example, the TFT 30 has an lightly doped drain (LDD) structure, and has a semiconductor layer 30a that is made up of polysilicon (polycrystal silicon of high purity) or the like, a gate insulating layer 11g that is formed on the semiconductor layer 30a, and a gate electrode 30g that is formed on the gate insulating layer 11g, and is made up of a polysilicon film or the like. The scanning line 3a also functions as the gate electrode 30g.

For example, an N-type impurity ion such as a phosphorus (P) ion, is implanted, and thereby, the semiconductor layer 30a is formed as the N-type TFT 30. Specifically, the semiconductor layer 30a includes a channel region 30c, a data line side LDD region 30s1, a data line side source and drain region 30s, a pixel electrode side LDD region 30d1, and a pixel electrode side source and drain region 30d.

On the channel region 30c, a P-type impurity ion such as a boron (B) ion, is doped. On other regions (30s1, 30s, 30d1, and 30d), the N-type impurity ion such as the phosphorus (P) ion, is doped. In this manner, the TFT 30 is formed as an N-type TFT.

On the gate electrode 30g and the gate insulating layer 11g, a first interlayer insulating layer 11b which is made up of the silicon oxide or the like, is formed. On the first interlayer insulating layer 11b, the capacity element 16 is arranged. Specifically, a first capacity electrode 16a as a pixel potential side capacity electrode that is electrically connected to the pixel electrode side source and drain region 30d of the TFT 30 and the pixel electrode 27, and a portion of the capacity line 3b (second capacity electrode 16b) as a fixed potential side capacity electrode, are arranged counter through a dielectric film 16c, and thereby, the capacity element 16 is formed.

The dielectric film 16c is, for example, a silicon nitride film. For example, the second capacity electrode 16b (capacity line 3b) includes at least one among high melting point metals such as titanium (Ti), chrome (Cr), tungsten (W), tantalum (Ta), and molybdenum (Mo), and is made of a metal simple substance, an alloy, metal silicide, polysilicide, or laminating thereof. Alternatively, it is possible to form of an aluminum (Al) film.

For example, the first capacity electrode 16a functions as a pixel potential side capacity electrode of the capacity element 16 which is made up of the polysilicon film having the conductivity. However, in the same manner as the capacity line 3b, the first capacity electrode 16a may be configured of a single layer film or a multilayer film including the metal or the alloy. The first capacity electrode 16a has the function of being relay-connected to the pixel electrode 27 and the pixel electrode side source and drain region 30d (other source and drain region) of the TFT 30 through contact holes CNT1, CNT3, and CNT4, in addition to the function as a pixel potential side capacity electrode.

On the capacity element 16, the data line 6a is formed through a second interlayer insulating layer 11c. The data line 6a is electrically connected to the data line side source and drain region 30s (one source and drain region) of the semiconductor layer 30a, through a contact hole CNT2 which is opened to the gate insulating layer 11g, the first interlayer insulating layer 11b, the dielectric film 16c, and the second interlayer insulating layer 11c.

On an upper layer of the data line 6a, the pixel electrode 27 is formed through a third interlayer insulating layer 11d. For example, the third interlayer insulating layer 11d is made up of the silicon oxide or the silicon nitride, and is processed with a flattening processing of flattening a convex portion of the surface generated by covering the region in which the TFT 30 is arranged. As a method of the flattening processing, for example, a chemical mechanical polishing processing (CMP processing), a spin coat processing, or the like, is exemplified. On the third interlayer insulating layer 11d, the contact hole CNT4 is formed.

The pixel electrode 27 which is an example of the electrode, is connected to the first capacity electrode 16a through the contact holes CNT4, and CNT3, and thereby, the pixel electrode 27 is electrically connected to the pixel electrode side source and drain region 30d of the semiconductor layer 30a. Furthermore, for example, the pixel electrode 27 is formed of a transparent conducting film such as an ITO film, or a metal film having light reflectivity such as the Al film.

On the third interlayer insulating layer 11d between the pixel electrodes 27 and the pixel electrodes 27 which is adjacent thereto, the inorganic oriented film 28 in which the inorganic materials such as the silicon oxide ($SiO_2$) are obliquely vapor deposited, is arranged. On the inorganic oriented film 28, the liquid crystal layer 15 in which the space surrounded by the seal material 14 (see FIG. 1 and FIG. 2) is filled with the liquid crystal, is arranged.

On the other hand, on the second base material 20a (liquid crystal layer 15 side), for example, an insulating layer 33 which is made up of a PSG film (silicon oxide in which the phosphorus is doped), or the like, is arranged. On the insulating layer 33, the counter electrode 31 is arranged all over the surfaces thereof. On the counter electrode 31, the inorganic oriented film 32 in which the inorganic materials such as the silicon oxide ($SiO_2$) are obliquely vapor deposited, is arranged. For example, the counter electrode 31 is made up of the transparent conducting film such as the ITO film, in the same manner as the pixel electrodes 27 described above.

The liquid crystal layer 15 is in a predetermined oriented state by the inorganic oriented films 28 and 32, in the state of occurring no electric field between the pixel electrode 27 and the counter electrode 31. In order to stick the element substrate 10 and the counter substrate 20 together, for example, the seal material 14 is the adhesive which is made up of a light curable resin or the heat curable resin, and is mixed with the spacer such as glass fiber or the glass beads so that a distance of the element substrate 10 and the counter substrate 20 becomes a predetermined value.

Structure of an Inorganic Oriented Film

FIG. 5 is a schematic cross-sectional view illustrating a structure of a prismatic structure (column) of an inorganic oriented film. FIG. 6 is a diagram illustrating a state of a surface of the inorganic oriented film in comparison with the related art and the present embodiment. Hereinafter, the structure of the inorganic oriented film and the state of the surface thereof, will be described with reference to FIG. 5 and FIG. 6. Furthermore, the inorganic oriented film of the element substrate 10 side, and the inorganic oriented film of the counter substrate 20 side, have the same structure. Accordingly, hereinbelow, the inorganic oriented films 28 and 32 are assumed as an M, and the structure of an inorganic oriented film M will be described.

As shown in FIG. 5, the inorganic oriented film M includes a first inorganic oriented film M1 as a first vapor deposited film which is formed on the element substrate 10, and a second inorganic oriented film M2 as a second vapor deposited film which is formed so as to cover the first inorganic oriented film M1. The first inorganic oriented film M1 is configured of the materials including the silicon oxide, for example, the silicon oxide ($SiO_2$). The second inorganic oriented film M2 is configured of the materials including the nitrogen, for example, the silicon nitride (SiN).

Moreover, in the first inorganic oriented film M1, by an oblique vapor deposition method, a first prismatic structure 71 which is inclined with respect to a surface 10b of the element substrate 10, is formed. In the second inorganic oriented film M2, in the same manner as the first inorganic oriented film M1, a second prismatic structure 72 which is inclined along the direction in which the first prismatic structure 71 is extended, is formed. In the embodiment, the second prismatic structure 72 is formed so as to cover a tip portion of the first prismatic structure 71.

In this manner, the second inorganic oriented film M2 which is an oblique vapor deposited film is laminated on the first inorganic oriented film M1 which is the oblique vapor deposited film, and thereby, as shown in FIG. 6, even when a silanol group (OH group) is present on a surface of the first inorganic oriented film M1 which is configured of the silicon oxide, since the second inorganic oriented film M2 configured of the silicon nitride is formed so as to cover the first inorganic oriented film M1, it can be suppressed that the silanol group is exposed on a surface of the inorganic oriented film M (it is possible to reduce the silanol group of the surface of the inorganic oriented film M).

Accordingly, it can be suppressed that orientation regulation force is lowered by causing a photochemical reaction, as the case where the inorganic oriented film M is irradiated with the light in which the silanol group is largely present. As a result, it can be suppressed that display quality is degraded.

Structure of a Vapor Deposition Device

Figure 7:
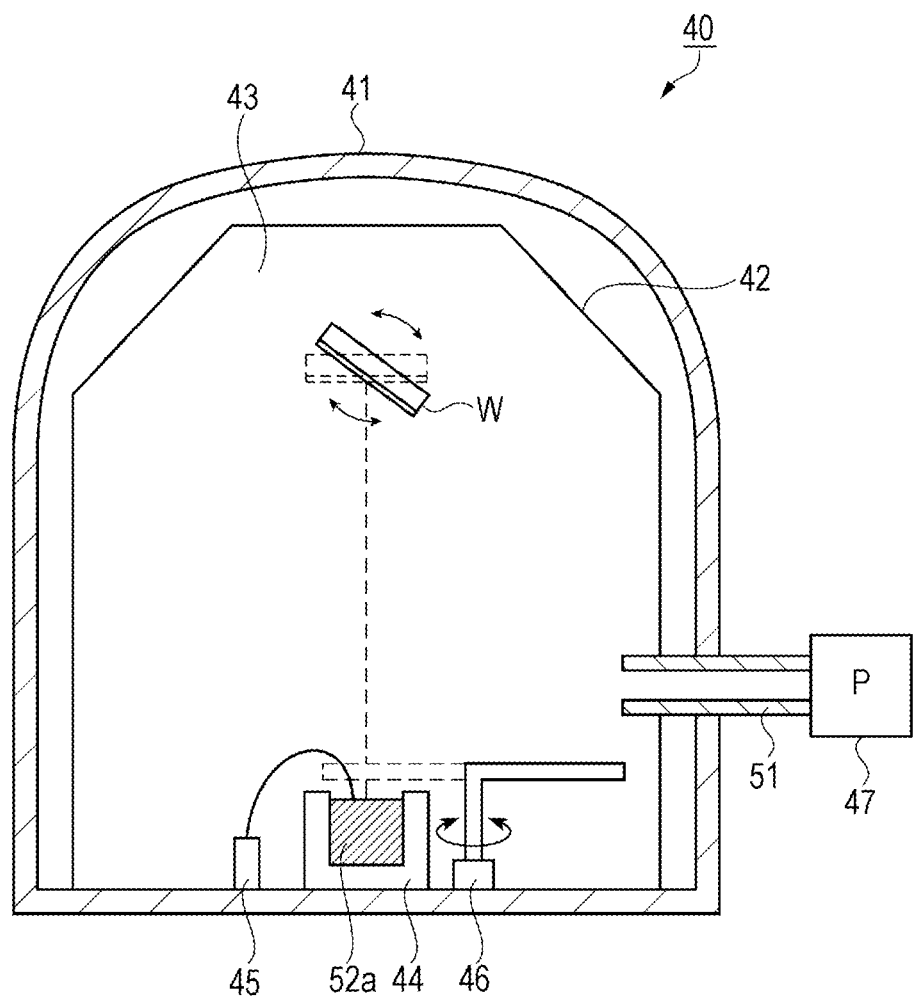
FIG. 7 is a schematic diagram illustrating a configuration of a vapor deposition device that processes a film in the vapor deposition to an element substrate (substrate to be processed) and a counter substrate (substrate to be processed) configuring the liquid crystal device.

FIG. 7 is a schematic diagram illustrating a configuration of a vapor deposition device that processes the film in the vapor deposition to the element substrate (substrate to be processed) and the counter substrate (substrate to be processed) configuring the liquid crystal device. Hereinafter, a structure of the vapor deposition device, will be described with reference to FIG. 7.

As shown in FIG. 7, a vapor deposition device 40 is a device which forms the inorganic oriented film M on the element substrate 10 and the counter substrate 20 (hereinbelow, referred to as "substrate to be processed W" as a substrate). For example, the vapor deposition device 40 includes a chamber 41 as a vacuum chamber, a sticking prevention plate 42, a film formation room 43, a vapor deposition source 44, an electron gun 45, a shutter 46, and a decompression device 47.

The chamber 41 is a container that is capable of accommodating the substrate to be processed W therein. For example, the chamber 41 is made up of the metal such as stainless steel. The chamber 41 is configured to be sealable, and is configured to decompress the inside thereof by the decompression device 47 which is connected through a piping 51.

On the inside of the chamber 41, the sticking prevention plate 42 that suppresses adhesion of the inorganic oriented film M to an inner wall of the chamber 41, is arranged along the inner wall of the chamber 41. The space which is surrounded by the sticking prevention plate 42, becomes the film formation room 43 that performs a vapor deposition processing.

In a downward center of the film formation room 43, the vapor deposition source 44 which a vapor deposition material 52a is put in, the electron gun 45 for sublimating the vapor deposition material 52a, and the shutter 46 that starts or stops the vapor deposition processing, are included. Furthermore, it is not limited to the electron gun 45, it may be nice if the vapor deposition material 52a is vaporized or is sublimated, and other heating means such as resistance heating and laser, may be used.

The vapor deposition material 52a is the silicon oxide ($SiO_2$) when the first inorganic oriented film M1 is formed, and is the silicon nitride (SiN) when the second inorganic oriented film M2 is formed.

The decompression device 47 is connected to the film formation room 43 through the piping 51. The decompression device 47 is configured so that a gas within the film formation room 43 is externally discharged, and a pressure within the film formation room 43 is lowered than an atmospheric pressure. As the decompression device 47, for example, a compressor or the like, can be used. The decompression device 47 is connected to a control device which is not illustrated, and is configured so that a predetermined pressure of the film formation room 43 can be maintained.

Upward of the vapor deposition source 44 in the film formation room 43, the substrate to be processed W is arranged. The substrate to be processed W is held at a desired angle, by a holding means which is not illustrated. Moreover, the holding means is capable of varying the angle of the substrate to be processed W, so that the oblique vapor deposition method or a vertical vapor deposition method can be performed with respect to a surface of the substrate to be processed W. Therefore, on the surface of the substrate to be processed W, by oblique vapor depositing the vapor deposition material 52a, the inorganic oriented film M is formed.

Method for Manufacturing a Liquid Crystal Device

Figure 9A:
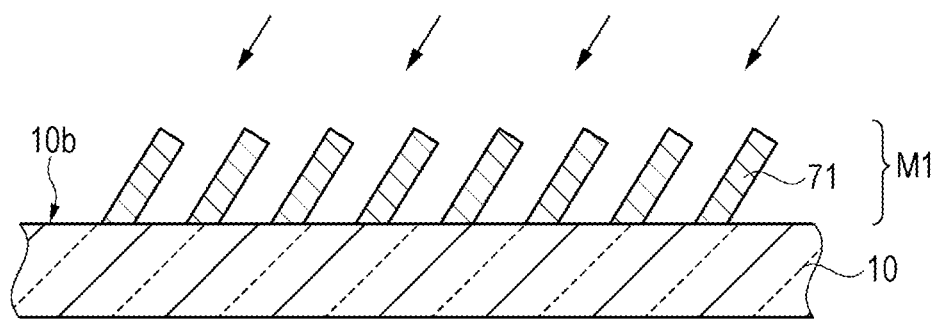
FIG. 9A and FIG. 9B are schematic cross-sectional views illustrating a method for forming an inorganic oriented film.
Figure 9B:
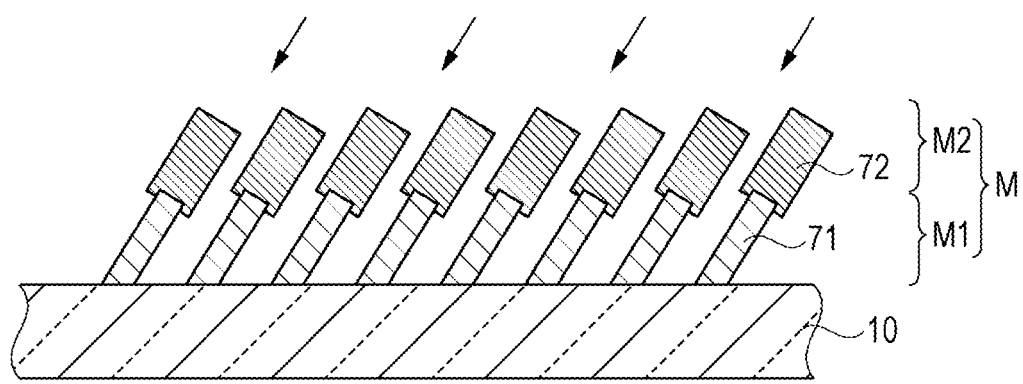

FIG. 8 is a flow chart illustrating a method for manufacturing a liquid crystal device in process order. FIG. 9A and FIG. 9B are schematic cross-sectional views illustrating a method for forming an inorganic oriented film (prismatic structure (column)). Hereinafter, the method for manufacturing a liquid crystal device, and the method for forming an inorganic oriented film, will be described with reference to FIG. 8, FIG. 9A, and FIG. 9B.

First, a method for manufacturing the element substrate 10 side, will be described. In step S11, the TFT 30 and the like, are formed on the first base material 10a which is made up of the glass substrate or the like. Specifically, using a well-known film formation technology, a photolithography technology, and an etching technology, the TFT 30 and the like are formed on the first base material 10a.

In step S12, the pixel electrode 27 is formed. Specifically, on the third interlayer insulating layer 11d, the pixel electrode 27 which is made up of the ITO film or the like, is formed using the well-known photolithography technology, and the etching technology.

In step S13, the first inorganic oriented film M1 is formed. Specifically, the first inorganic oriented film M1 is formed by the oblique vapor deposition method, so as to cover the pixel electrode 27 or the like, using the vapor deposition device 40 which is shown in FIG. 7.

The vapor deposition material 52a of the first inorganic oriented film M1 is the silicon oxide ($SiO_2$). Hereby, as shown in FIG. 9A, on the surface of the element substrate 10, the first inorganic oriented film M1 having the first prismatic structure 71 which is stacked in a prismatic shape so as to be inclined at the predetermined angle, is formed.

In step S14, the second inorganic oriented film M2 is formed on the first inorganic oriented film M1. As a method for manufacturing the second inorganic oriented film M2, the inorganic materials such as the silicon nitride (SiN) are obliquely vapor deposited. Hereby, as shown in FIG. 9B, the second prismatic structure 72 is formed so as to cover the tip portion of the first prismatic structure 71.

Hereby, it is possible to cover the silanol group (OH group) which is largely present on the surface of the first inorganic oriented film M1, with the silicon nitride, and it is possible to reduce the silanol group which is exposed on the surface of the inorganic oriented film M. As above, the element substrate 10 side is completed. Next, a method for manufacturing the counter substrate 20 side, will be described.

First, in step S21, on the second base material 20a which is made up of the translucency materials such as the glass substrate, using the well-known film formation technology, the photolithography technology, and the etching technology, the counter electrode 31 is formed.

In step S22, the first inorganic oriented film M1 is formed on the counter electrode 31. The method for manufacturing the first inorganic oriented film M1, is formed, for example, using the oblique vapor deposition method, in the same manner as the first inorganic oriented film M1 of the element substrate 10 side described above.

In step S23, the second inorganic oriented film M2 is formed on the first inorganic oriented film M1. A method for manufacturing the second inorganic oriented film M2, is the same as the method for manufacturing the second inorganic oriented film M2 of the element substrate 10 side described above.

Hereby, as shown in FIG. 6, it can be suppressed that the OH group remains on the surface of the inorganic oriented film M (it is possible to reduce the OH group), in comparison with the related art. As above, the counter substrate 20 side is completed. Next, a method for sticking the element substrate 10 and the counter substrate 20 together, will be described.

In step S31, the seal material 14 is applied onto the element substrate 10. In detail, a relative position relationship between the element substrate 10 and a dispenser (which can be also a discharge device) is changed, and the seal material 14 is applied to the periphery portion of the display region E in the element substrate 10 (so as to surround the display region E).

In step S32, the element substrate 10 and the counter substrate 20 are stuck together. Specifically, the element substrate 10 and the counter substrate 20 are stuck together, through the seal material 14 which is applied to the element substrate 10.

In step S33, the liquid crystal is injected to an internal portion the structure from a liquid crystal injection port (not illustrated), and thereafter, the liquid crystal injection port is sealed. In the sealing, for example, sealing materials such as the resin may be used. As above, the liquid crystal device 100 is completed.

Figure 10:
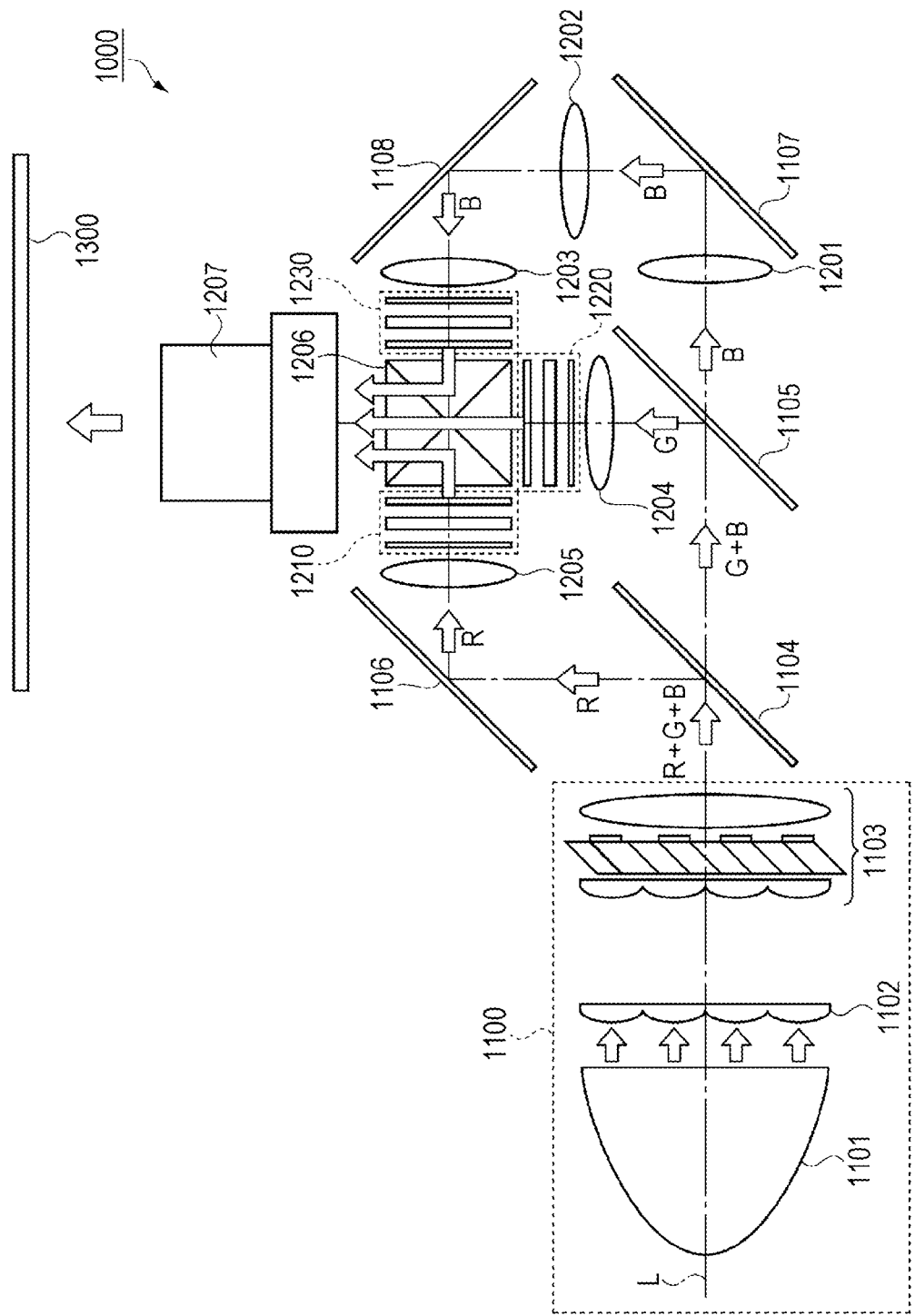
FIG. 10 is an outline diagram illustrating a configuration of a projection type display apparatus including the liquid crystal device.

Next, a projection type display apparatus as an electronic apparatus according to the embodiment, will be described with reference to FIG. 10. FIG. 10 is an outline diagram illustrating a configuration of the projection type display apparatus including the liquid crystal device described above.

As shown in FIG. 10, a projection type display apparatus 1000 according to the embodiment, includes a polarization lighting device 1100 that is arranged along a system optical axis L, two dichroic mirrors 1104 and 1105 as a light separation element, three reflection mirrors 1106, 1107, and 1108, five relay lenses 1201, 1202, 1203, 1204, and 1205, three transmission type liquid crystal light valves 1210, 1220, and 1230 as a light modulation means, a cross dichroic prism 1206 as a photosynthesis element, and a projection lens 1207.

The polarization lighting device 1100 is schematically configured of a lamp unit 1101 as a light source which is made up of a white color light source such as a super high pressure mercury lamp and a halogen lamp, an integrator lens 1102, and a polarization conversion element 1103.

The dichroic mirror 1104 reflects red color light (R), and transmits green color light (G) and blue color light (B), among polarization light beams which are emitted from the polarization lighting device 1100. The other dichroic mirror 1105 reflects the green color light (G) which is transmitted through the dichroic mirror 1104, and transmits the blue color light (B).

The red color light (R) which is reflected by the dichroic mirror 1104, is incident to the liquid crystal light valve 1210 through the relay lens 1205 after being reflected by the reflection mirror 1106. The green color light (G) which is reflected by the dichroic mirror 1105, is incident to the liquid crystal light valve 1220 through the relay lens 1204. The blue color light (B) which is transmitted through the dichroic mirror 1105, is incident to the liquid crystal light valve 1230 through a light guide system which is made up of the three relay lenses 1201, 1202, and 1203, and the two reflection mirrors 1107 and 1108.

The liquid crystal light valves 1210, 1220, and 1230 respectively are arranged counter, with respect to incidence faces of the respective color lights of the cross dichroic prism 1206. The color light which is incident to the liquid crystal light valves 1210, 1220, and 1230, is modulated on the basis of video information (video signal), and is emitted toward the cross dichroic prism 1206.

Four rectangular prisms are stuck together in the prism, and thereby, on an inner face of the prism, a dielectric multilayer film reflecting the red color light and a dielectric multilayer film reflecting the blue color light, are formed in a cross shape. The three color lights are synthesized by the dielectric multilayer films, and the light expressing a color image is synthesized. The synthesized light is projected onto a screen 1300 by the projection lens 1207 which is a projection optical system, and the image is enlargedly displayed.

The liquid crystal light valve 1210 is made to which the liquid crystal device 100 described above is applied. The liquid crystal device 100 is arranged placing a gap between a pair of the polarization elements which are arranged in a cross nicol in the incidence side and the emission side of the color light. Other liquid crystal light valves 1220 and 1230 are made in the same manner.

According to the projection type display apparatus 1000 described above, since the liquid crystal light valves 1210, 1220, and 1230 are used, it is possible to obtain high electrical reliability.

Furthermore, as an electronic apparatus in which the liquid crystal device 100 is mounted, other than the projection type display apparatus 1000, various electronic apparatuses such as an electronic viewfinder (EVF), a mobile mini projector, a head up display, a smart phones, a mobile phone, a mobile computer, a digital camera, a digital video camera, a display, an on-board unit, an audio instrument, an exposure device, and a lighting apparatus, can be used.

As described above in detail, according to the liquid crystal device 100 of the first embodiment, the method for manufacturing the liquid crystal device 100, and the electronic apparatus, effects which are shown hereinafter, are obtained.

(1) According to the liquid crystal device 100 of the first embodiment, and the method for manufacturing the liquid crystal device 100, by covering the silanol group which is present on the surface of the first inorganic oriented film M1 configured of the silicon oxide, with the second inorganic oriented film M2 including the silicon nitride, it can be suppressed that the silanol group is exposed on the surface of the inorganic oriented film M. Accordingly, for example, it can be suppressed that the orientation regulation force is lowered by causing the photochemical reaction, as the case where the inorganic oriented film M is irradiated with the light in which the silanol group is present on the surface. As a result, it can be suppressed that the display quality is degraded.

(2) According to the liquid crystal device 100 of the first embodiment, and the method for manufacturing the liquid crystal device 100, since the first inorganic oriented film M1 of a first layer and the second inorganic oriented film M2 of a second layer are formed by the oblique vapor deposition from the same direction, it is possible to maintain a orientation direction.

(3) According to the electronic apparatus of the first embodiment, since the liquid crystal device 100 described above is included, it is possible to provide the electronic apparatus in which degradation of the display quality is suppressed.

Second Embodiment

Figure 11:
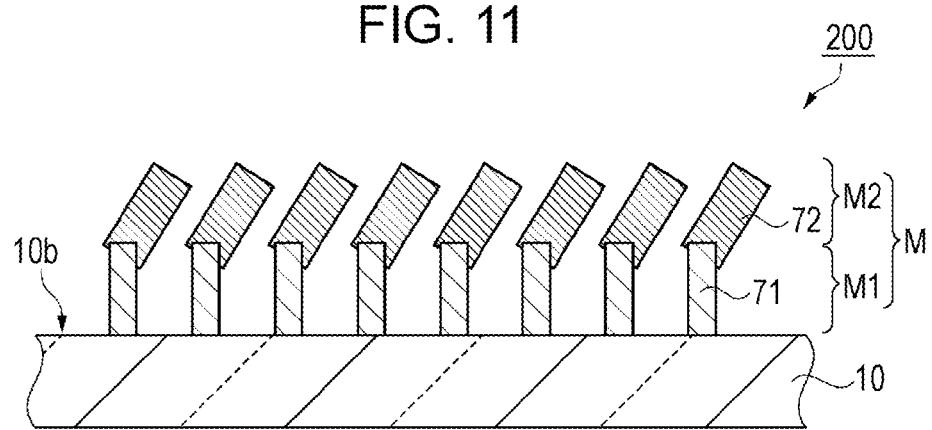
FIG. 11 is a schematic cross-sectional view illustrating a structure of a liquid crystal device according to a second embodiment.
Figure 12A:
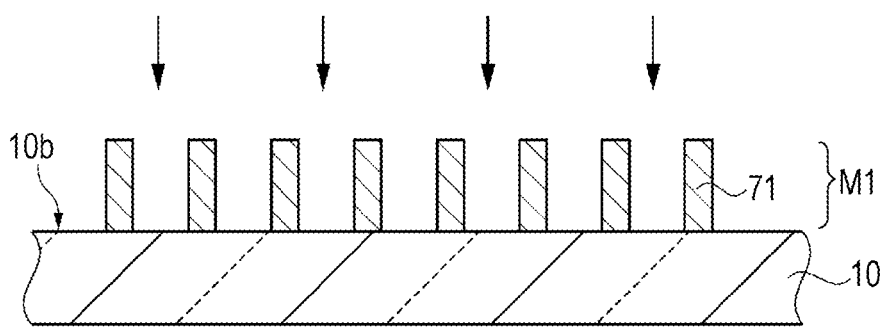
FIG. 12A and FIG. 12B are schematic cross-sectional views illustrating a method for manufacturing an inorganic oriented film in process order.
Figure 12B:
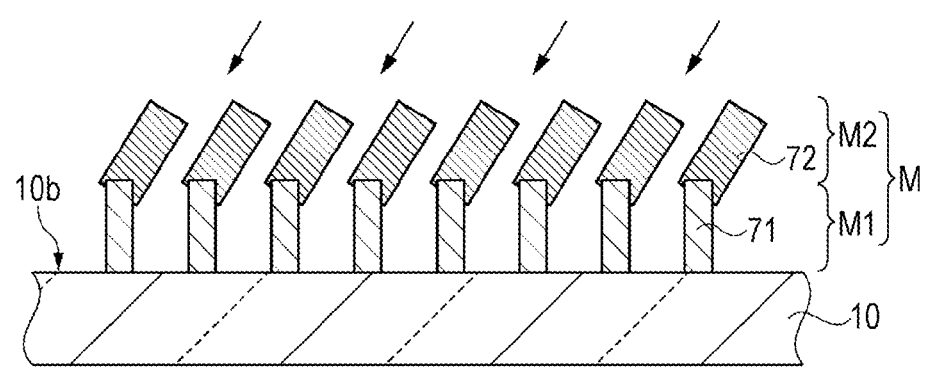

Configuration of a Liquid Crystal Device, and Method for Manufacturing a Liquid Crystal Device FIG. 11 is a schematic cross-sectional view illustrating a structure of a liquid crystal device according to a second embodiment. FIG. 12A and FIG. 12B are schematic cross-sectional views illustrating a method for manufacturing an inorganic oriented film in process order, among a method for manufacturing a liquid crystal device. Hereinafter, the liquid crystal device, and the method for manufacturing a liquid crystal device, will be described with reference to FIG. 11, FIG. 12A, and FIG. 12B.

In a liquid crystal device 200 of the second embodiment, a portion where the first inorganic oriented film M1 is vertically formed with respect to the surface 10b of the element substrate 10, is different, and other portions are the same in general, in comparison with the liquid crystal device 100 of the first embodiment described above. Therefore, in the second embodiment, the portion which is different from that in the first embodiment will be described in detail, and the description of other overlapped portions is appropriately omitted.

As shown in FIG. 11, the liquid crystal device 200 of the second embodiment, has the first inorganic oriented film M1 that is the vertical vapor deposited film which is formed on the element substrate 10, and is configured of the silicon oxide, and the second inorganic oriented film M2 that is the oblique vapor deposited film which is formed on the first inorganic oriented film M1, and is configured of the silicon nitride.

As the method for forming the inorganic oriented film M, as shown in FIG. 12A, first, the first prismatic structure 71 of the silicon oxide is vertically vapor deposited, so as to be vertically formed with respect to the surface 10b of the element substrate 10.

Next, as shown in FIG. 12B, on the first inorganic oriented film M1, the second prismatic structure 72 of the silicon nitride is vapor deposited by the oblique vapor deposition method, so as to be inclined with respect to the surface 10b of the element substrate 10.

In this manner, the first inorganic oriented film M1 which is the vertical vapor deposited film, is vertically formed with respect to the surface 10b of the element substrate 10, and thereby, for example, it can be suppressed that the first inorganic oriented film M1 is not formed on a portion which is a shadow of the pixel electrode 27 as the oblique vapor deposition (see FIG. 2, and FIG. 4). Accordingly, it is possible to enhance orientation properties.

In addition, the second inorganic oriented film M2 is formed on the first inorganic oriented film M1, and thereby, even when the silanol group (OH group) is present on the surface of the first inorganic oriented film M1 which is configured of the silicon oxide, since the second inorganic oriented film M2 configured of the silicon nitride is formed so as to cover the first inorganic oriented film M1, it can be suppressed that the silanol group is exposed on the surface of the inorganic oriented film M (it is possible to reduce the silanol group of the surface).

As described above in detail, according to the liquid crystal device 200 of the second embodiment, and the method for manufacturing the liquid crystal device 200, in addition to the effects of the above (1), the effects which are shown hereinafter, are obtained.

(4) According to the liquid crystal device 200 of the second embodiment, since the first inorganic oriented film M1 of the first layer is formed by the vertical vapor deposition method, for example, it can be suppressed that the inorganic oriented film M is not arranged on the portion which is the shadow of the pixel electrode 27 as the oblique vapor deposition. Accordingly, it is possible to enhance the orientation properties.

Third Embodiment

Liquid Crystal Device, and Method for Manufacturing a Liquid Crystal Device

Figure 13:
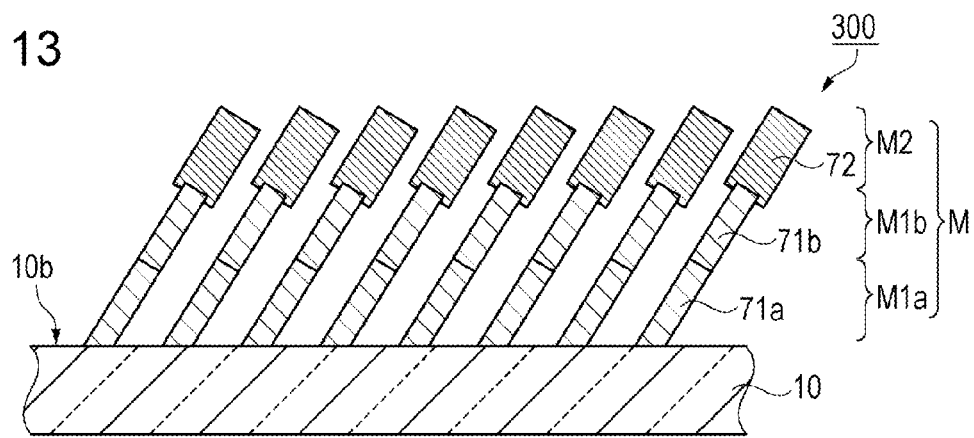
FIG. 13 is a schematic cross-sectional view illustrating a structure of a liquid crystal device according to a third embodiment.
Figure 14A:
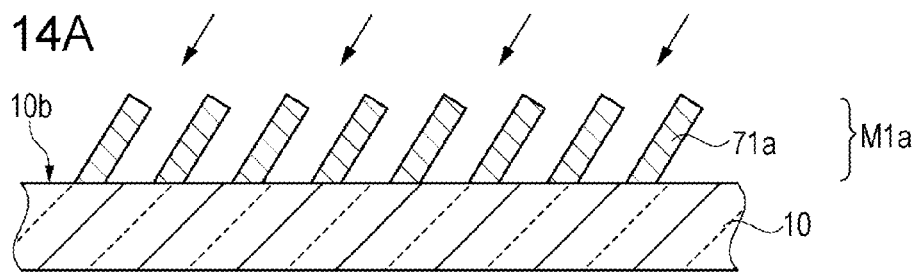
FIG. 14A, FIG. 14B, and FIG. 14C are schematic cross-sectional views illustrating a method for manufacturing an inorganic oriented film in process order.
Figure 14B:
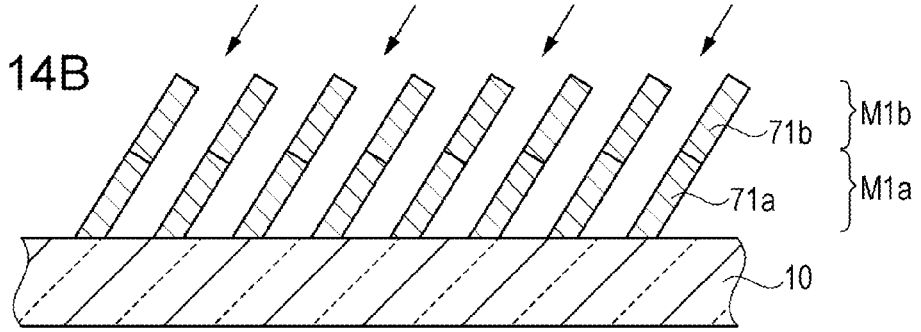
Figure 14C:
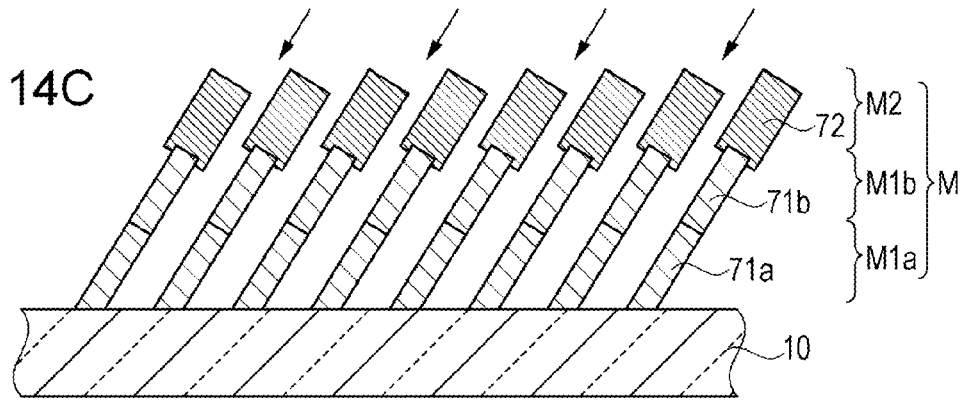

FIG. 13 is a schematic cross-sectional view illustrating a structure of a liquid crystal device according to a third embodiment. FIG. 14A, FIG. 14B, and FIG. 14C are schematic cross-sectional views illustrating a method for manufacturing an inorganic oriented film in process order, among a method for manufacturing a liquid crystal device. Hereinafter, the liquid crystal device, and the method for manufacturing a liquid crystal device, will be described with reference to FIG. 13, FIG. 14A, FIG. 14B, and FIG. 14C.

In a liquid crystal device 300 of the third embodiment, a portion where the first inorganic oriented film M1 configured of the silicon oxide is configured to be two layers, is different, and other portions are the same in general, in comparison with the liquid crystal device 100 of the first embodiment described above. Therefore, in the third embodiment, the portion which is different from that in the first embodiment will be described in detail, and the description of other overlapped portions is appropriately omitted.

As shown in FIG. 13, the liquid crystal device 300 of the third embodiment, has a first inorganic oriented film M1a that is the oblique vapor deposited film which is formed on the element substrate 10, and is configured of the silicon oxide, a first inorganic oriented film M1b that is the oblique vapor deposited film which is configured of the silicon oxide in the same manner, and the second inorganic oriented film M2 that is the oblique vapor deposited film which is formed on the first inorganic oriented film M1b, and is configured of the silicon nitride.

As the method for forming the inorganic oriented film M, as shown in FIG. 14A, first, a first prismatic structure 71a of the silicon oxide is obliquely vapor deposited, so as to be inclined with respect to the surface 10b of the element substrate 10.

Next, as shown in FIG. 14B, on the first inorganic oriented film M1a having the first prismatic structure 71a, the first inorganic oriented film M1b having a first prismatic structure 71b which is configured of the silicon oxide, is obliquely vapor deposited.

Thereafter, as shown in FIG. 14C, on the first inorganic oriented film M1b, the second inorganic oriented film M2 which is configured of the silicon nitride, is obliquely vapor deposited.

In this manner, the first inorganic oriented films M1a and M1b of two layers which are configured of the silicon oxide, are obliquely vapor deposited, and, on the first inorganic oriented film M1b, the second inorganic oriented film M2 which is configured of the silicon nitride, is obliquely vapor deposited, and thereby, the orientation direction can be maintained better, in comparison with the inorganic oriented film M of the first embodiment.

As described above in detail, according to the liquid crystal device 300 of the third embodiment, and the method for manufacturing the liquid crystal device 300, in addition to the effects of the above (1), the effects which are shown hereinafter, are obtained.

(5) According to the liquid crystal device 300 of the third embodiment, and the method for manufacturing the liquid crystal device 300, since the first inorganic oriented film M1a of the first layer, the first inorganic oriented film M1b of the second layer, and the second inorganic oriented film M2 are formed by the oblique vapor deposition from the same direction, the orientation direction can be maintained better.

Fourth Embodiment

Liquid Crystal Device, and Method for Manufacturing a Liquid Crystal Device

Figure 15:
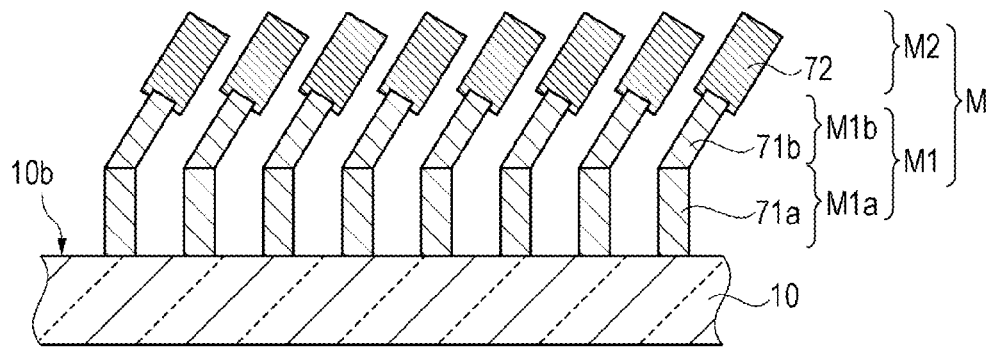
FIG. 15 is a schematic cross-sectional view illustrating a structure of a liquid crystal device according to a fourth embodiment.
Figure 16A:
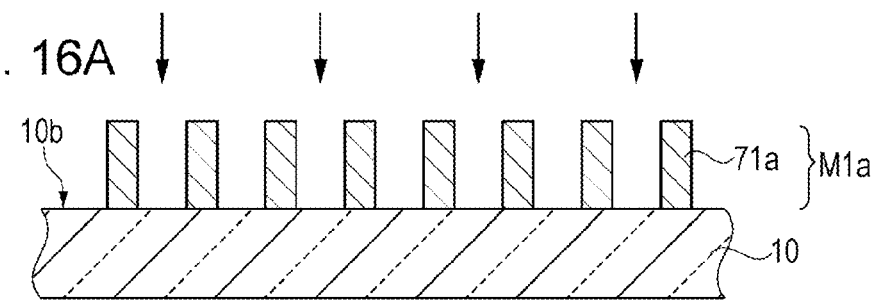
FIG. 16A, FIG. 16B, and FIG. 16C are schematic cross-sectional views illustrating a method for manufacturing an inorganic oriented film in process order.
Figure 16B:
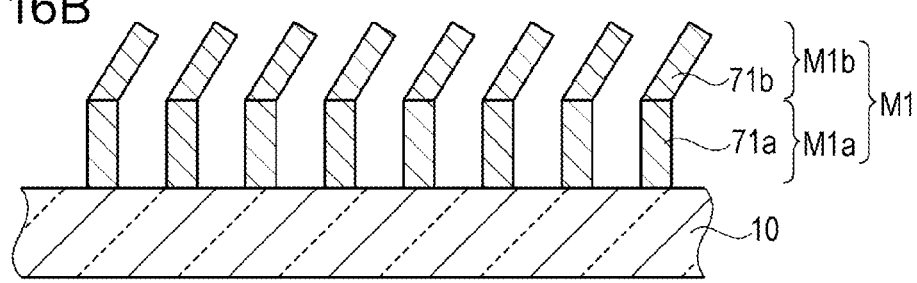
Figure 16C:
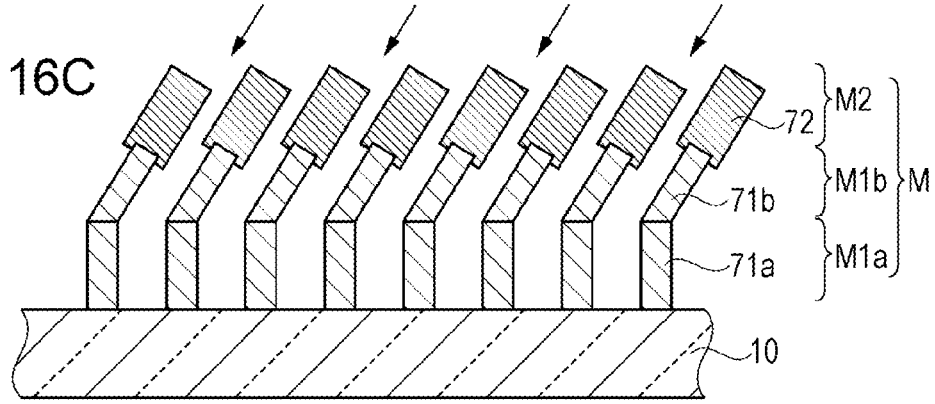

FIG. 15 is a schematic cross-sectional view illustrating a structure of a liquid crystal device according to a fourth embodiment. FIG. 16A, FIG. 16B, and FIG. 16C are schematic cross-sectional views illustrating a method for manufacturing an inorganic oriented film in process order, among a method for manufacturing a liquid crystal device. Hereinafter, the liquid crystal device, and the method for manufacturing a liquid crystal device, will be described with reference to FIG. 15, FIG. 16A, FIG. 16B, and FIG. 16C.

In a liquid crystal device 400 of the fourth embodiment, a portion where the first inorganic oriented film M1a of the first layer that is the vertical vapor deposited film which is configured of the silicon oxide, is vertically formed with respect to the surface 10b of the element substrate 10, is different, and other portions are the same in general, in comparison with the liquid crystal device 300 of the third embodiment described above. Therefore, in the fourth embodiment, the portion which is different from that in the third embodiment will be described in detail, and the description of other overlapped portions is appropriately omitted.

As shown in FIG. 15, the liquid crystal device 400 of the fourth embodiment, has the first inorganic oriented film M1a that is the vertical vapor deposited film which is formed on the element substrate 10, and is configured of the silicon oxide, the first inorganic oriented film M1b of the second layer that is the oblique vapor deposited film which is configured of the silicon oxide in the same manner, and the second inorganic oriented film M2 that is the oblique vapor deposited film which is formed on the first inorganic oriented film M1b, and is configured of the silicon nitride.

As the method for forming the inorganic oriented film M, as shown in FIG. 16A, first, the first prismatic structure 71a of the silicon oxide is vapor deposited, so as to be vertical with respect to the surface 10b of the element substrate 10.

Next, as shown in FIG. 16B, on the first inorganic oriented film M1a of the first layer, the first inorganic oriented film M1b of the second layer which is configured of the silicon oxide, is obliquely vapor deposited.

Thereafter, as shown in FIG. 16C, on the first inorganic oriented film M1b, the second inorganic oriented film M2 which is configured of the silicon nitride, is obliquely vapor deposited.

In this manner, the first inorganic oriented film M1a of the first layer is vertically formed with respect to the surface 10b of the element substrate 10, the first inorganic oriented film M1b is obliquely vapor deposited thereon, and, on the first inorganic oriented film M1b, the second inorganic oriented film M2 which is configured of the silicon nitride, is obliquely vapor deposited, and thereby, for example, it can be suppressed that the first inorganic oriented film M1a is not formed on the portion which is the shadow of the pixel electrode 27 as the oblique vapor deposition, in comparison with the inorganic oriented film M of the third embodiment. Accordingly, it is possible to enhance the orientation properties.

As described above in detail, according to the liquid crystal device 400 of the fourth embodiment, and the method for manufacturing the liquid crystal device 400, in addition to the effects of the above (1), the effects which are shown hereinafter, are obtained.

(6) According to the liquid crystal device 400 of the fourth embodiment, since the first inorganic oriented film M1a of the first layer is formed by the vertical vapor deposition, the first inorganic oriented film M1b of the second layer is obliquely vapor deposited, and, furthermore, the second inorganic oriented film M2 is obliquely vapor deposited, it can be suppressed that the inorganic oriented film M is not arranged on the portion which is the shadow of the pixel electrode 27. Accordingly, it is possible to enhance the orientation properties. In addition, the orientation direction can be maintained better.

Furthermore, aspects of the invention are not limited to the embodiments described above, can be appropriately modified within a scope which is not against the gist or the idea of the invention read from the scope of the appended claims and the entire specification, and are included in a technological scope of the aspects of the invention. Moreover, it can be carried out in the following forms.

Modification Example 1

As described above, the second inorganic oriented film M2 which is configured of the silicon nitride, is not limited to be formed so as to cover the tip portion of the first inorganic oriented film M1 of the foundation, and, for example, it may be formed so as to cover approximately the whole of the first inorganic oriented film M1 which is the foundation.

Figure 17:
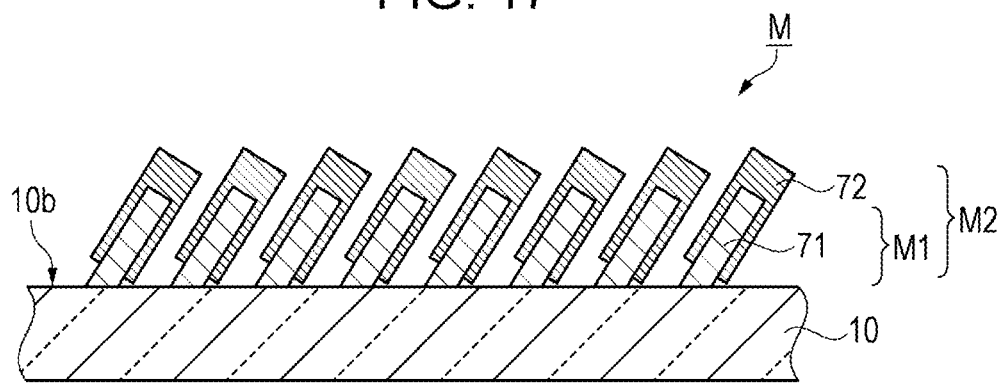
FIG. 17 is a schematic cross-sectional view illustrating a structure of an inorganic oriented film which is an example of Modification Example 1.
Figure 18:
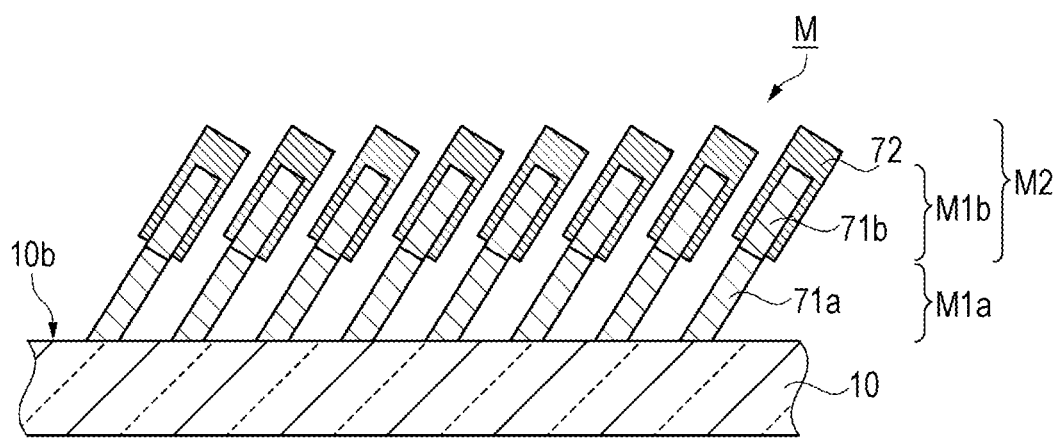
FIG. 18 is a schematic cross-sectional view illustrating a structure of an inorganic oriented film which is another example of Modification Example 1.

FIG. 17 and FIG. 18 are schematic cross-sectional views illustrating a structure of an inorganic oriented film which is an example of Modification Example 1. In the inorganic oriented film M which is shown in FIG. 17, in comparison with the inorganic oriented film M of the first embodiment, a portion where the second inorganic oriented film M2 is formed up to the vicinity of a root (close to the surface 10b of the element substrate 10) of the first inorganic oriented film M1 which is the foundation, is different. According to this, even when the silanol group is present on the surface of the first inorganic oriented film M1, since the second inorganic oriented film M2 configured of the silicon nitride is formed so as to cover the first inorganic oriented film M1, it can be suppressed that the silanol group is exposed on the surface of the inorganic oriented film M.

In the inorganic oriented film M which is shown in FIG. 18, in comparison with the inorganic oriented film M of the third embodiment, a portion where the second inorganic oriented film M2 is formed so as to cover approximately the whole of the first inorganic oriented film M1b of the second layer which is the foundation of the second inorganic oriented film M2, is different. According to this, since the second inorganic oriented film M2 is formed to so as to cover the first inorganic oriented film M1b of the second layer, the orientation direction can be maintained better.

The entire disclosure of Japanese Patent Application No. 2013-211679, filed Oct. 9, 2013 is expressly incorporated by reference herein.

What is claimed is:

1. A liquid crystal device comprising:
   a liquid crystal layer; and
   an inorganic oriented film between the liquid crystal layer and an electrode,
   wherein the inorganic oriented film has
   a first vapor deposited film that has a prismatic structure including silicon oxide, and
   a second vapor deposited film that is formed so as to cover at least a portion of the prismatic structure, the second vapor deposited film comprising silicon nitride, and
   wherein the first vapor deposited film is formed between the second vapor deposited film and the electrode.

2. The liquid crystal device according to claim 1,
   wherein the first vapor deposited film is a vertical vapor deposited film, and
   the second vapor deposited film is an oblique vapor deposited film.

3. The liquid crystal device according to claim 1,
   wherein the first vapor deposited film and the second vapor deposited film are oblique vapor deposited films.

4. A method for manufacturing a liquid crystal device, comprising:
   forming an electrode on a base material;
   forming a first vapor deposited film that has a prismatic structure including silicon oxide on the electrode and the base material;
   forming a second vapor deposited film that includes nitrogen so as to cover at least a portion of the first vapor deposited film, the forming of the second vapor deposited film comprising vapor depositing silicon nitride on the first vapor deposited film; and
   arranging a liquid crystal layer on the second vapor deposited film,
   wherein the first vapor deposited film is formed between the second vapor deposited film and the electrode.

5. The method for manufacturing a liquid crystal device according to claim 4,
   wherein the first vapor deposited film is formed by a vertical vapor deposition method, and
   the second vapor deposited film is formed by an oblique vapor deposition method.

6. The method for manufacturing a liquid crystal device according to claim 4,
   wherein the first vapor deposited film and the second vapor deposited film are formed by an oblique vapor deposition method.

7. An electronic apparatus comprising:
   the liquid crystal device according to claim 1.

8. An electronic apparatus comprising:
   the liquid crystal device according to claim 2.

9. An electronic apparatus comprising:
   the liquid crystal device according to claim 3.

* * * * *